United States Patent
Maruta et al.

(10) Patent No.: US 7,037,732 B2
(45) Date of Patent: May 2, 2006

(54) METHOD AND DEVICE FOR CUTTING WIRE FORMED ON SEMICONDUCTOR SUBSTRATE

(75) Inventors: Yukio Maruta, Kasugai (JP); Kinichi Mizuno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 10/708,587

(22) Filed: Mar. 12, 2004

(65) Prior Publication Data

US 2005/0085088 A1  Apr. 21, 2005

(30) Foreign Application Priority Data

Oct. 21, 2003  (JP) .............................. 2003-361072

(51) Int. Cl.
*H01L 21/00* (2006.01)
(52) U.S. Cl. ..................... 438/4; 438/462; 438/712; 438/961
(58) Field of Classification Search ............. 438/4, 438/462, 710, 712, 961; 219/121.18, 121.19, 219/121.2

See application file for complete search history.

(56) References Cited

U.S. PATENT DOCUMENTS

| 4,609,809 | A | * | 9/1986 | Yamaguchi et al. ...... 219/121.2 |
| 5,086,015 | A | * | 2/1992 | Itoh et al. ................. 219/121.2 |
| 5,926,688 | A | * | 7/1999 | Lee et al. ........................ 438/4 |
| 6,225,626 | B1 | * | 5/2001 | Talbot et al. ................ 250/307 |
| 6,509,276 | B1 | * | 1/2003 | Scott ........................... 438/712 |
| 6,653,240 | B1 | * | 11/2003 | Crawford .................... 438/712 |
| 6,878,614 | B1 | * | 4/2005 | Sun et al. .................... 438/601 |
| 2004/0038433 | A1 | * | 2/2004 | Fischer et al. ................. 438/4 |

OTHER PUBLICATIONS

"Achieving Quick Design Debugging With Circuit Correction Function Using Focused Ion Beam Technique"; IBM, Jun. 23, 1999, http://www-6.ibm.com/jp/chips/v5_1/mn51011.html.

* cited by examiner

*Primary Examiner*—Kevin M. Picardat
(74) *Attorney, Agent, or Firm*—Armstrong, Kratz, Quintos, Hanson & Brooks, LLP (57) ABSTRACT

Method and device for cutting a wire with a small number of processing operations. The method includes forming a cut portion by scanning the semiconductor substrate with a focused ion beam to cut the wire. The method further includes forming a clear region continuously from the cut portion by scanning the semiconductor substrate with the focused ion beam. The clear region is free of stray material of the wire.

16 Claims, 6 Drawing Sheets

METHOD AND DEVICE FOR CUTTING WIRE FORMED ON SEMICONDUCTOR SUBSTRATE

CROSS REFERENCE TO RELATED APPLICATIONS

This application is based upon and claims the benefit of priority from the prior Japanese Patent Application No. 2003-361072, filed on Oct. 21, 2003, the entire contents of which are incorporated herein by reference.

BACKGROUND OF THE INVENTION

The present invention relates to a method and apparatus for cutting a wire formed on a semiconductor substrate by scanning the wire with a focused ion beam.

Semiconductor integrated circuits (e.g., LSI) have become highly integrated and provided with higher functions over recent years. When developing an LSI, logic for many circuits must be corrected. More specifically, when a circuit does not function due to a logic error or a layout error, a focused ion beam process is performed to cut a wire at the location where the error occurred. There is a demand for technology that ensures the cutting of the wire with a focused ion beam.

A device (FIB device) for cutting a wire that is formed on a semiconductor substrate with a focused ion beam is known in the prior art. An example of such an FIB device was described on the Internet (URL, http://www-6.ibm.com/jp/chips/v5_/mn51011.html) in an online article titled "Achieving Quick Design Debugging With Circuit Correction Function Using Focused Ion Beam Technique" published by IBM on Jun. 23, 1999 (available in searches as of Sep. 16, 2003).

Figure 1:
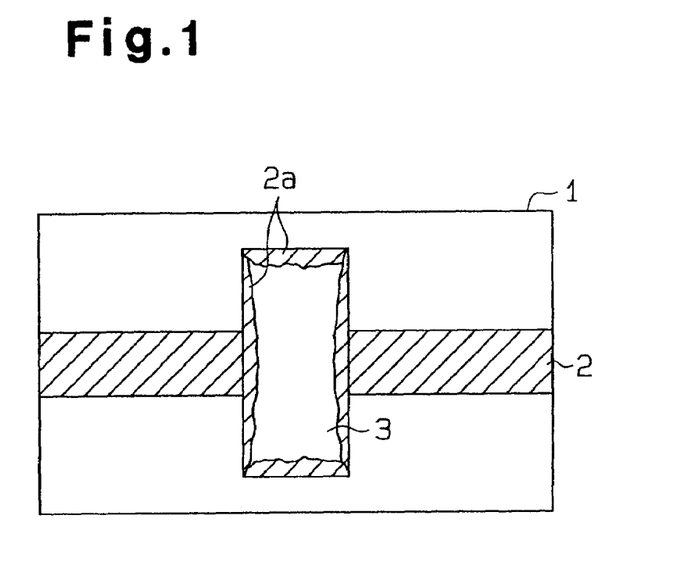
FIG. 1 is a plan view showing a processing pattern in the prior art.
Figure 2:
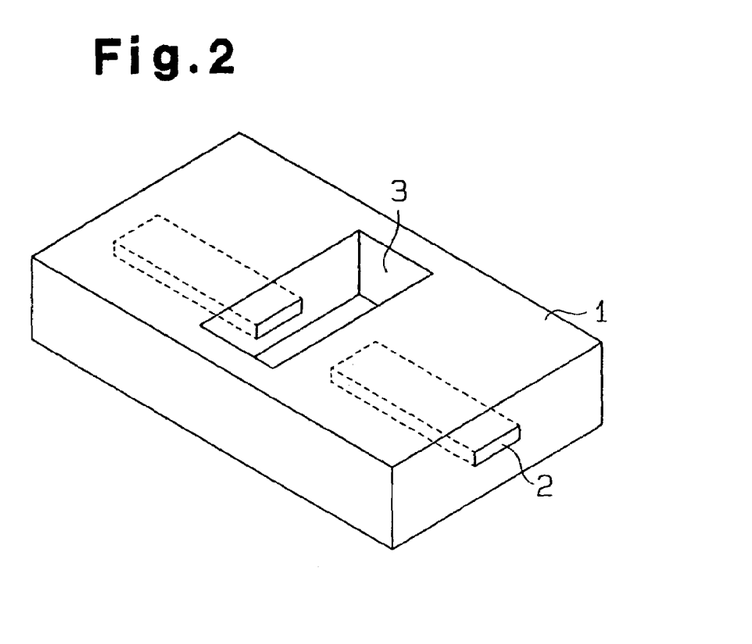
FIG. 2 is a perspective view showing the processing pattern in the prior art.

Referring to FIGS. 1 and 2, an FIB device scans a wire 2 with a focused ion beam to form a rectangular pattern that extends across the wire 2. During scanning, stray material 2a produced when cutting the wire 2 is dispersed radially and adhered to the walls of a processed portion 3. This may result in unintended short-circuiting between wires. To prevent such short-circuiting, the above article describes a cleaning technique using halogen-containing gas, or gas assisted etching (GAE). In this technique, the halogen-containing gas is injected toward the surface of a semiconductor substrate. The stray material 2a reacts with the gas molecules in the halogen-containing gas and forms a volatile product. This minimizes the adherence of the stray material 2a to the processed portion 3.

When cutting aluminum wires of an LSI with the FIB device, powdered stray material adheres to the walls of the processed portion. In such a case, unintended short-circuiting between wires seldom occur.

SUMMARY OF THE INVENTION

However, in recent years, copper is often used as the material of the wire. When cutting copper wires with an FIB device, the stray material is viscous. Thus, the stray material may cause undesirable short-circuiting. Gas assisted etching must be performed to prevent such short-circuiting. However, when cutting wires through gas assisted etching, know-how, such as how to perform gas assisted etching in accordance with the wire thickness, the wire width, and the surrounding conditions of the wire becomes necessary. This increases the number of processing operations required to cut a wire.

The present invention provides a method and device that ensures the cutting of a wire with a small number of processing operations.

The present invention provides a method for cutting a wire formed on a semiconductor substrate. The method including forming a cut portion by scanning the semiconductor substrate with a focused ion beam to cut the wire, and forming a clear region free of stray material from the wire, continuously from the cut portion by scanning the semiconductor substrate with the focused ion beam.

A further aspect of the present invention is a method for cutting a wire formed on a semiconductor substrate. The method including forming a cut portion by scanning the semiconductor substrate with a focused ion beam to cut the wire, and forming a redundant portion, continuously from the cut portion, for preventing stray material from the wire from being formed continuously with the cut portion.

A further aspect of the present invention is a method for cutting a wire formed on a semiconductor substrate. The method including setting a cutting mode of the wire in accordance with the material of the wire, forming a cut portion by scanning the semiconductor substrate with a focused ion beam to cut the wire, and forming a clear region free of stray material from the wire, continuously from the cut portion by scanning the semiconductor substrate with the focused ion beam when a predetermined cutting mode is set.

A further aspect of the present invention is a device for cutting a wire formed on a semiconductor substrate. The device including a processor for cutting a wire by scanning the semiconductor substrate with a focused ion beam, and a controller, connected to the processor, for controlling the scanning with the focused ion beam. The controller controls the processor to form a cut portion by cutting the wire and form a clear region free of stray material from the wire, continuously from the cut portion.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

A method and device according to a preferred embodiment of the present invention will now be discussed with reference to FIGS. 3 to 9.

Figure 3:
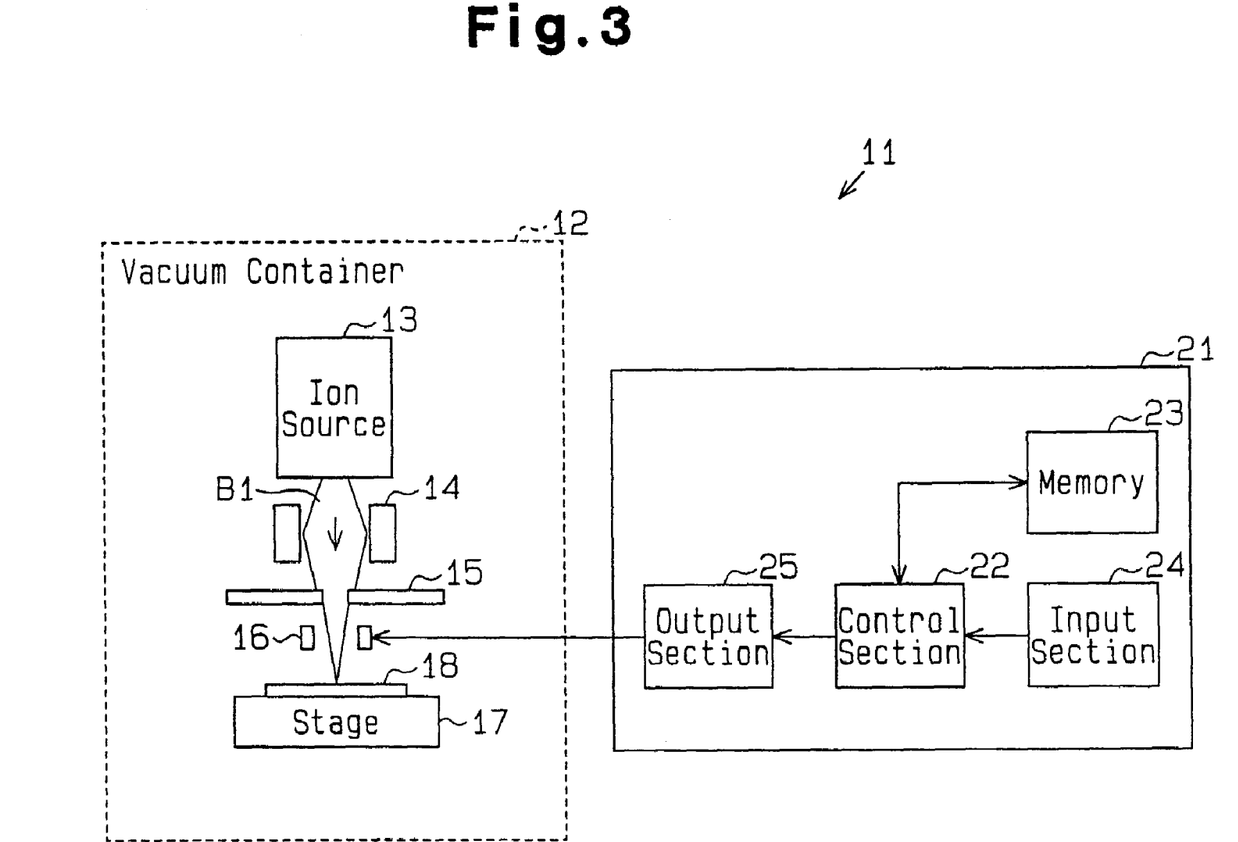
FIG. 3 is a schematic block diagram of an FIB device according to a preferred embodiment of the present invention.

FIG. 3 is a schematic block diagram of a focused ion beam processing device (FIB device) 11 that cuts wires formed on a semiconductor substrate 18.

The FIB device 11 includes a vacuum container 12. The vacuum container 12 accommodates a processor, which includes an ion source 13, an electronic system 14, an aperture 15, a deflector 16, and a stage 17. In the FIB device 11, the ion source 13 emits an ion beam B1. The electronic system 14 applies a predetermined acceleration voltage to the ion beam B1 to focus the ion beam B1. The ion beam B1 is further focused when passing through the aperture 15. Then, the deflector (scanning deflector) 16 deflects the ion beam B1. This emits the ion beam B1 toward a sample (semiconductor substrate 18 on which a wire subject to cutting is formed), which is arranged on the stage 17. The deflector 16 adjusts the emitting position of the ion beam B1 in accordance with a scan control signal from a controller 21 of the FIB device 11.

The controller 21 includes a control section 22, a memory 23, an input section 24, and an output section 25. The control section 22 is configured by a known central processing unit (CPU) and executes various controls in accordance with control programs stored in the memory 23. In addition to the control programs, the memory 23 stores pattern data corresponding to processing patterns of the ion beam B1.

A user uses the input section 24, which includes an operation panel (not shown), to generate a request or an instruction. For example, the user uses the input section 24 to have the control section 22 execute a control program or to input various parameters. Based on pattern data provided from the control section 22, the output section 25 generates the scan control signal, which is in accordance with the corresponding processing pattern, and provides the scan control signal to the deflector 16. In accordance with the scan control signal, the deflector 16 adjusts the scanning direction and scanning amount of the ion beam B1. In this manner, the ion beam B1 is emitted to the semiconductor substrate 18 to cut a wire.

Figure 4:
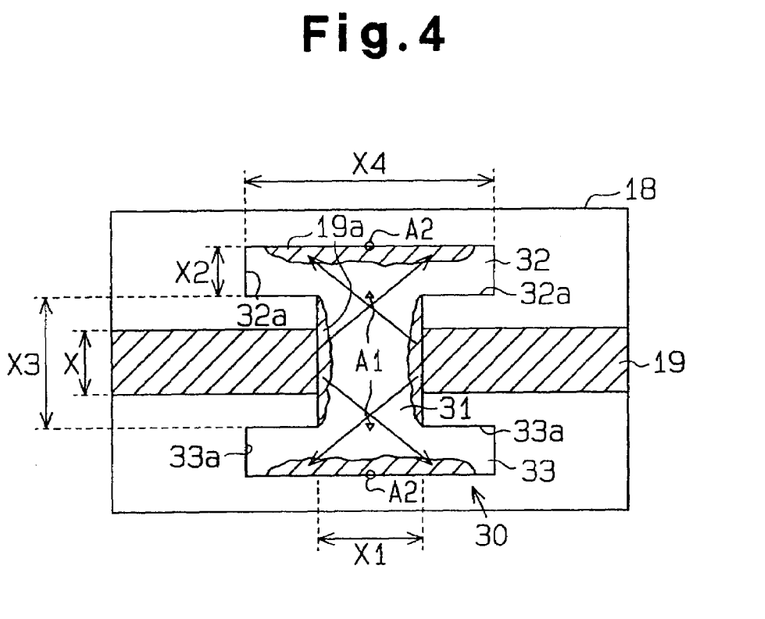
FIG. 4 is a plan view showing an H-shaped processing pattern in the preferred embodiment.
Figure 5:
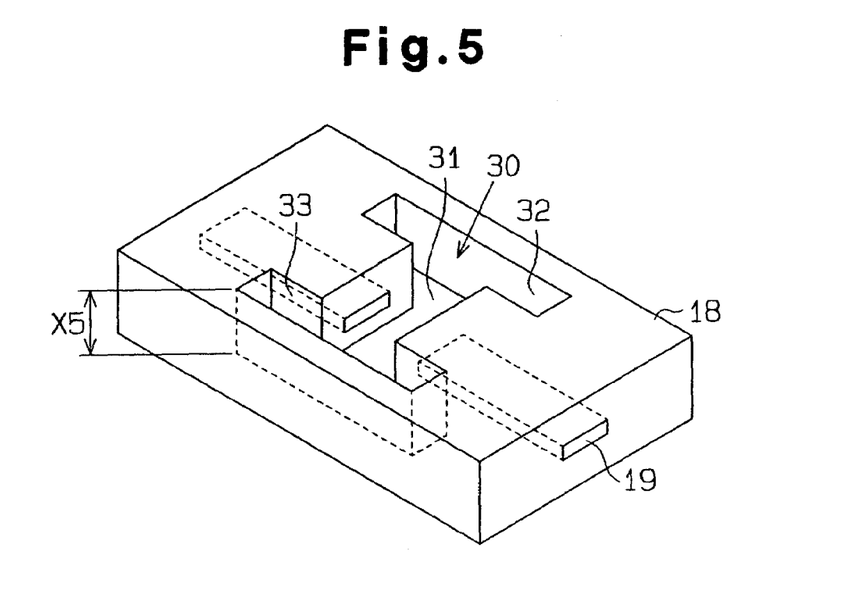
FIG. 5 is a perspective view showing the processing pattern of FIG. 4.

As shown in FIGS. 4 and 5, the FIB device 11 cuts a copper wire 19, which is formed on the semiconductor substrate 18 with an H-shaped processing pattern. That is, when cutting the cooper wire 19, the emission of the ion beam B1 forms a processed portion 30 that is H-shaped when seen from above. The processed portion 30 includes a rectangular first cavity (cut portion) 31, which extends across the copper wire 19 at the cut location, and rectangular second and third cavities (redundant portions) 32 and 33, which extend perpendicular to the first cavity 31. The second and third cavities 32 and 33 are formed by cutting an insulation layer region (region in which the copper wire 19 is not formed) continuously from the first cavity 31.

The dimensions of each of the cavities 31 to 33 (widths X1 and X2 and lengths X3 and X4) are set at appropriate values in accordance with the width X of the copper wire 19 that is subject to cutting. The wire 19 of the semiconductor substrate 18 has a predetermined depth. Thus, the depth X5 of the processed portion 30 is set in accordance with the wire 19. Each of the cavities 31 to 33 have the same depth X5.

Scanning with the ion beam B1 radially disperses stray material 19a of the wire 19. Thus, the stray material 19a adheres to the walls of the processed portion 30, as shown in the state of FIG. 4. In this state, the H-shaped processed portion 30 includes clear regions 32a, which are free of the stray material 19a. The clear regions 32a are located on the two walls of the second cavity 32 extending in opposite directions from the first cavity 31, and the end wall extending from each of these walls in second cavity 32. The processed portion 30 further includes clear regions 33a, which is free of the stray material 19a. The clear regions 33a are located on the two walls of the second cavity 33 extending in opposite directions from the first cavity 31, and the end wall extending from each of these walls in second cavity 33. In other words, in the H-shaped processed portion 30, the stray material 19a adheres to the two opposing walls of the first cavity 31 and to part of the walls that are separated from the first cavity 31 in the second and third cavities 32 and 33. The clear regions 32a and 33a prevent electrical short-circuiting that may be caused by the stray material 19a.

Figure 6:
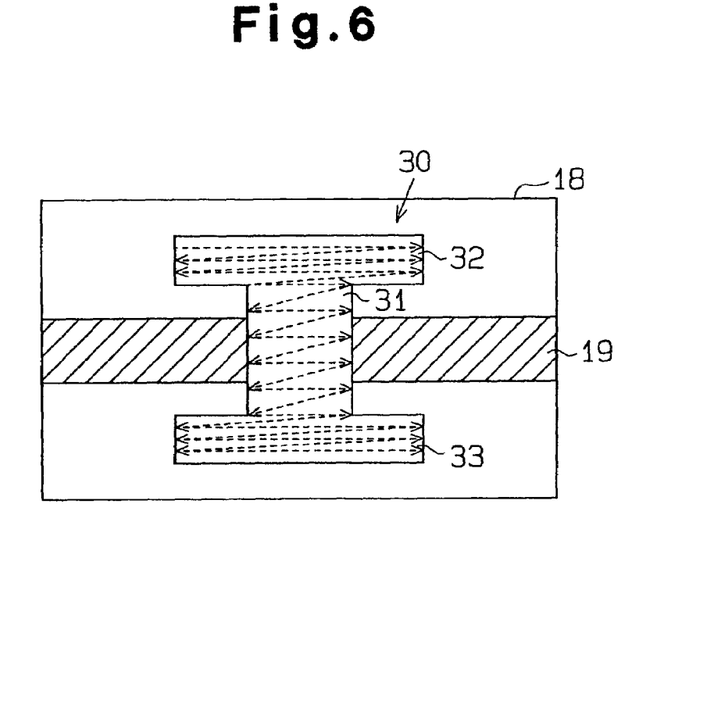
FIG. 6 is a plan view showing the scanning direction of the ion beam in the preferred embodiment.
Figure 7:
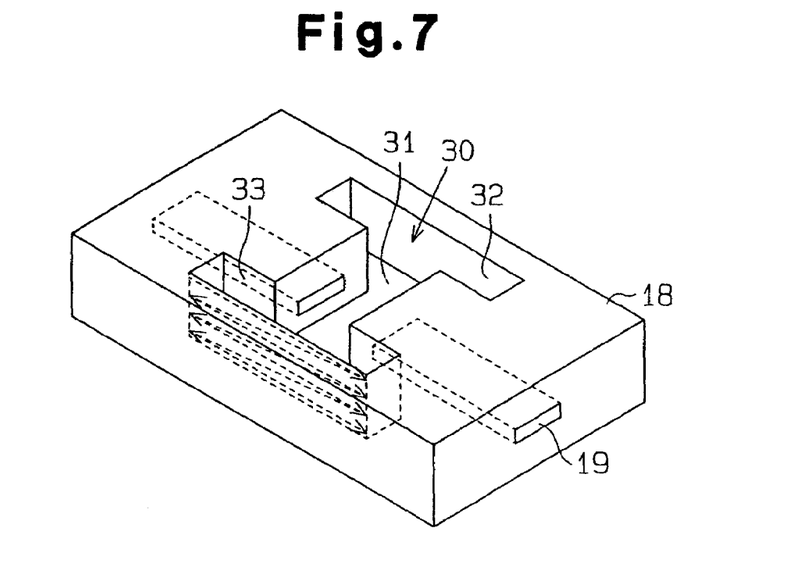
FIG. 7 is a perspective view showing the scanning direction of the ion beam of FIG. 6.

FIGS. 6 and 7 show the scanning direction of the ion beam B1 in the preferred embodiment with the arrows. Referring to FIG. 6, the FIB device 11 scans the semiconductor substrate 18 with the ion beam B1 to cut out a predetermined depth of the H-shaped processed portion 30. Then, referring to FIG. 7, the FIB device 11 scans the semiconductor substrate 18 with the ion beam B1 so as to gradually increase the cut depth until completing the three-dimensional processed portion 30. In the preferred embodiment, the FIB device 11 controls the deflector 16 so that the scanning direction of the ion beam B1 is parallel to the direction in which the wire 19 extends. However, this is only one example of the scanning direction of the ion beam B1, and the scanning direction may be perpendicular to the scanning direction shown in FIGS. 6 and 7.

Figure 8:
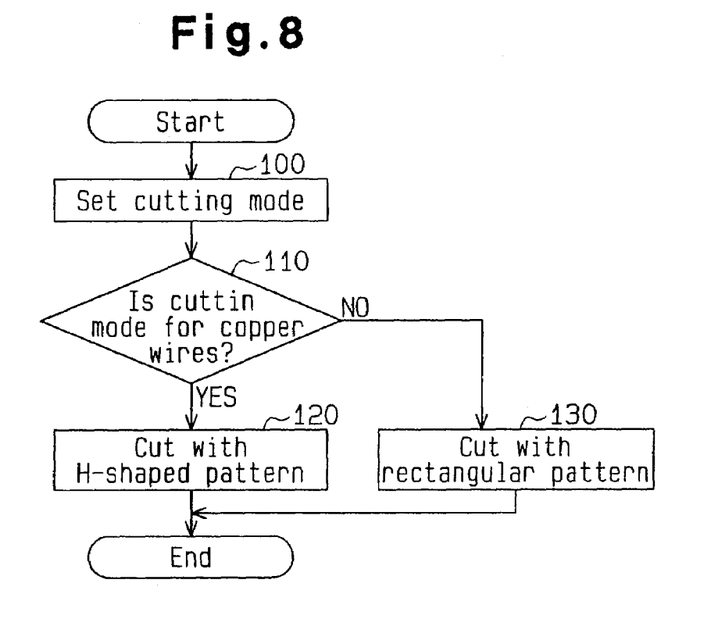
FIG. 8 is a flowchart of a wire cutting process in the preferred embodiment.

FIG. 8 is a flowchart showing the cutting process of the wire 19 in the preferred embodiment. The user operates the input section 24 (operation panel) of the controller 21 to start the control program. After activation of the control program, the user operates the input section 24 to set parameters, such as those representing the cutting mode of the wire 19 or the cutting position of the wire 19. The cutting mode is selected from a plurality of cutting modes in accordance with the material of the wire 19 (e.g., copper or aluminum). The cutting position is set by, for example, designating two points located on opposite sides of the wire 19 at the position in which the user wishes to cut the wire 19. In the preferred embodiment, the two points lie along the sides of the first cavity 31 as indicated by the triangles denoted A1 in FIG. 4.

In step 100, the control section 22 receives an operation signal when the user operates the input section 24. The control section 22 then temporarily stores data, which is set in accordance with the operation signal (e.g., cutting mode, cutting position, width of wire 19, depth of processed portion 30), in the memory 23.

In step 110, the control section 22 determines the cutting mode that has been set by the user. The control section 22 proceeds to step 120 when the cutting mode is set for copper wires and proceeds to step 130 when the cutting mode is set for other types of wires, such as aluminum wires.

In step 120, the control section 22 reads the pattern data corresponding to the H-shaped processing pattern from the memory 23. For example, a processing pattern that takes into consideration the width of the wire 19 or the depth of the processed portion 30 is selected, and the pattern data corresponding to the selected pattern data is read. The control section 22 then provides the pattern data and the cutting position data to the output section 25. The output section 25 provides the deflector 16 with a scanning control signal that corresponds to the data. In accordance with the scan control signal, the deflector 16 adjusts the ion beam B1 that performs scanning. In this manner, the FIB device 11 cuts the copper wire 19 with an H-shaped processing pattern.

When the cutting mode is set for aluminum wires, in step 130, the control section 22 reads pattern data corresponding to the rectangular (the prior art shape shown in FIG. 1) from the memory 23. The control section 22 provides the pattern data and cutting position data to the output section 25. The output section 25 provides the deflector 16 with a scanning control signal that corresponds to the data. In accordance with the scan control signal, the deflector 16 adjusts the ion beam B1 that performs scanning to cut the wire 19.

When ion beam processing is being performed to cut the copper wire 19, the beam emission heats the copper wire 19 and elongated (fiberized) molten stray material 19a adheres to the wall of the processed portion 30. When the fiberized stray material 19a is continuously connected, electrical short-circuiting may occur in the copper wire 19. To prevent such short-circuiting, the copper wire 19 is cut with an H-shaped processing pattern in the preferred embodiment. Further, aluminum is a material that is harder than copper. Thus, when the aluminum wire is cut, minute particulates of stray material are dispersed and adhered to the wall of the processed portion 30. However, the particulates of the stray material have high resistance and resists electrical short-circuiting. Accordingly, the aluminum wire is cut with the rectangular processing pattern of the prior art.

Figure 9:
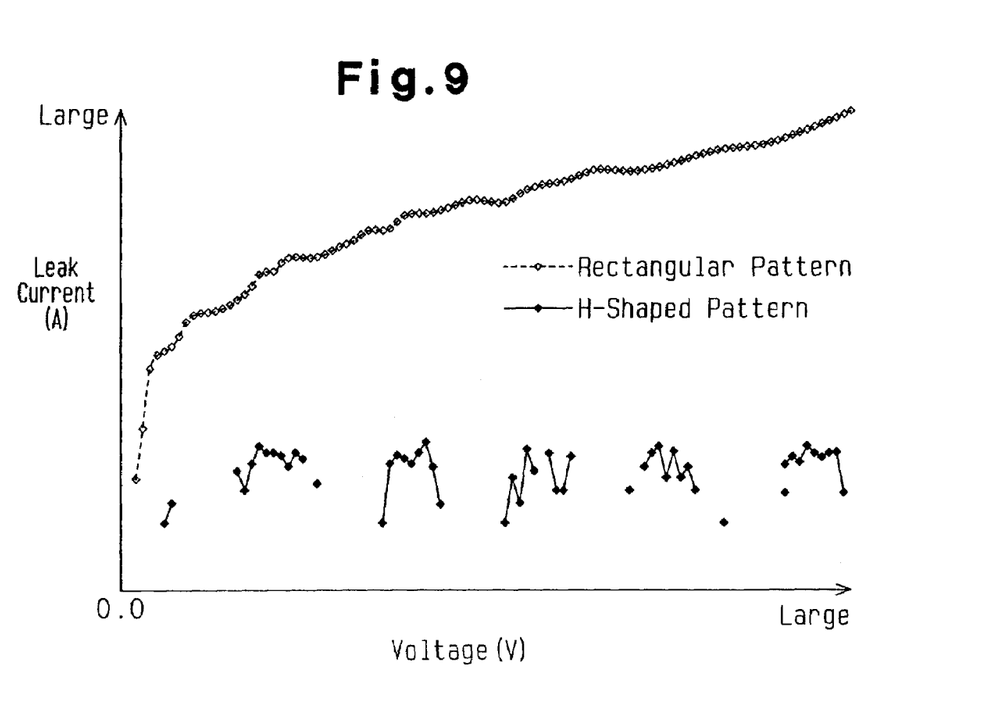
FIG. 9 is a graph showing the relationship between voltage and leak current.

FIG. 9 shows the measurement result of leak current when the copper wire 19 was cut with the H-shaped processing pattern and when the copper wire 19 was cut with the rectangular processing pattern of the prior art. A predetermined voltage was applied between the wires subsequent to cutting in order to measure the leak current at the processed portion 30.

As shown in FIG. 9, the leak current increased in accordance with the applied voltage when the copper wire 19 was cut with the rectangular processing pattern. During application of a few volts of voltage, leak current was measured at a picoampere level. In comparison, when the copper wire 19 was cut with the H-shaped processing pattern, the leak current did not change and remained at a level that could not be measured even when the applied voltage was increased. In other words, the H-shaped processing pattern prevents electrical short-circuiting caused by the stray material 19a and ensures the cutting of the copper wire 19.

The FIB device 11 of the preferred embodiment has the advantages described below.

(1) The ion beam B1 cuts out an H-shaped portion and thus forms the clear regions 32a and 33a in which the stray material 19a does not adhere to the walls of the processed portion 30. As a result, electrical short-circuiting caused by the stray material 19a is prevented and the cutting of the copper wire 19 is ensured without having to perform gas assisted etching, which requires complicated know-how.

(2) Since a device for supplying gas that would be required when performing gas assisted etching is not necessary, the FIB device is inexpensive. In addition, special gases, such as halogen gas, are not used. This prevents the environment from being affected in an undesirable manner by such gases.

(3) The user operates the input section 24 of the controller 21 to set the cutting position of the wire 19 (the two points A1 located on opposite sides of the first cavity 31). Afterwards, automatic scanning with the ion beam B1 is performed to form the H-shaped processing pattern. That is, the user only sets the positions of two points as the cutting position of the wire 19 to cut out the H-shaped processing pattern. Accordingly, the user easily performs the setting for cutting the wire 19.

(4) The memory 23 of the controller 21 stores pattern data corresponding to the processing patterns. Accordingly, the FIB device 11 uses the pattern data to accurately cut the wire 19 with the H-shaped processing pattern.

(5) The FIB device 11 cuts the copper wire 19 with the H-shaped processing pattern and cuts the aluminum wire with the rectangular shape of the prior art. In this manner, the wire is cut with the processing pattern that is optimal for the material of the wire.

It should be apparent to those skilled in the art that the present invention may be embodied in many other specific forms without departing from the spirit or scope of the invention. Particularly, it should be understood that the present invention may be embodied in the following forms.

In the preferred embodiment, the FIB device 11 cuts the copper wire 19 with the H-shaped processing pattern. In addition, the copper wire 19 may be cut with a U-shaped or Z-shaped processing pattern. It is only required that the processed portion 30 have a clear region free of the stray material 19a.

When the FIB device 11 cuts a wire with a plurality of processing patterns, such as an H-shaped pattern and a Z-shaped pattern, the memory 23 may store pattern data corresponding to each of the processing patterns. This would enable the optimal processing pattern to be selected from various patterns in accordance with the layout of the wire 19 when cutting the wire 19.

In the preferred embodiment, the cutting position of the copper wire 19 is set by the two points A1, as shown in FIG. 4. However, the cutting position does not necessarily have to be set in such a manner. For example, the processed portion 30 may be formed in the semiconductor substrate 18 by setting two points A2, as indicated by the circles denoted A2 in FIG. 4.

In the preferred embodiment, the user operates the input section 24 to input the cutting position of the copper wire 19 in the FIB device 11. The FIB device 11 may be configured so that the user may set the dimensions W1 to W5 and/or positions of the cavities 31 to 33.

Figure 10:
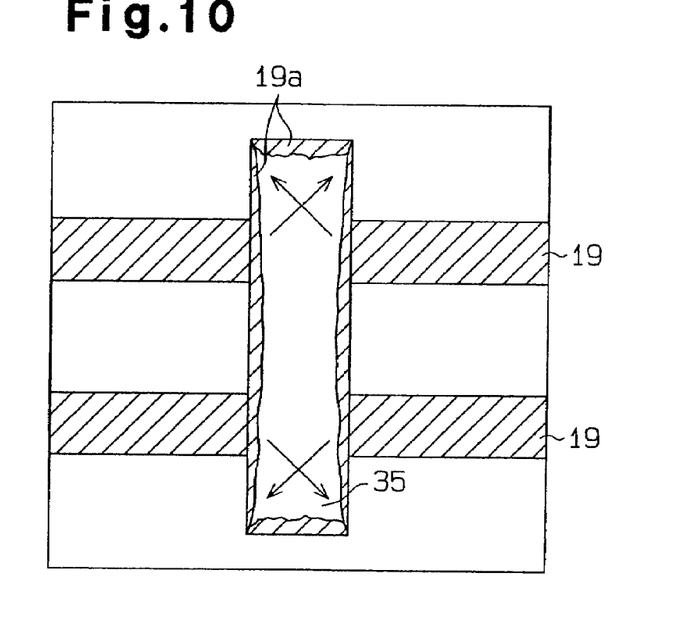
FIG. 10 is a plan view showing a processing pattern in the prior art.
Figure 11:
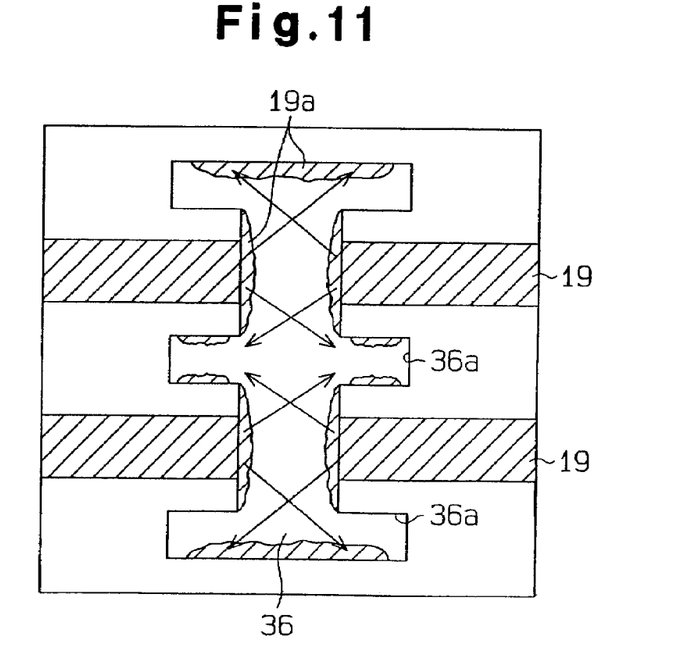
FIG. 11 is a plan view showing a further processing pattern in a further embodiment of the present invention.

In the above description, the FIB device 11 cuts only one copper wire 19. However, the number of wires that are cut is not limited in the present invention. The present invention may also be applied when simultaneously cutting a plurality of wires 19 that are located near one another. For example, when cutting two copper wires 19 with the rectangular pattern as shown in FIG. 10, stray material 19a adheres entirely to the wall of the rectangular processed portion 35. This may cause short-circuiting in each wire 19. In the present invention, the two copper wires 19 are cut with partially overlapped H-shaped processing patterns, as shown in FIG. 11, to form clear regions 36a in which the stray material 19a is not adhered to the wall of the processed portion 36.

The FIB device 11 may be provided with the gas supply device. In this structure, gas assisted etching is performed when cutting a wire with an H-shaped processing pattern. The gas assisted etching ensures the cutting of the copper wire 19.

The present examples and embodiments are to be considered as illustrative and not restrictive, and the invention is not to be limited to the details given herein, but may be modified within the scope and equivalence of the appended claims.

The invention claimed is:

1. A method for cutting a wire formed on a semiconductor substrate, the method comprising:
    forming a cut portion by scanning the semiconductor substrate with a focused ion beam to cut the wire; and
    forming a clear region free of stray material from the wire, horizontally continuously from the cut portion by scanning the semiconductor substrate with the focused ion beam.

2. The method according to claim 1, wherein said forming a cut portion includes forming a first cavity that cuts the wire by scanning the semiconductor substrate with the focused ion beam, and said forming a clear region includes forming a second cavity and a third cavity that intersect the first cavity on opposite sides of the wire.

3. A method, for cutting a wire formed on a semiconductor substrate, the method comprising:
    forming a cut portion by scanning the semiconductor substrate with a focused ion beam to cut the wire:
    forming a clear region free of stray material from the wire, continuously from the cut portion by scanning the semiconductor substrate with the focused ion beam;
    wherein said forming a cut portion includes forming a first cavity that cuts the wire by scanning the semiconductor substrate with the focused ion beam, and said forming a clear region includes forming a second cavity and a third cavity that intersect the first cavity on opposite sides of the wire; and
    wherein the first, second, and third cavities when combined form an H-shaped pattern.

4. The method according to claim 2, further comprising: setting positions of two points lying on opposite ends of the cut portion;
    wherein said forming a cut portion includes forming the first cavity based on the positions of the two points, and said forming a clear region includes forming the second and third cavities continuously with the first cavity based on the positions of the two points.

5. The method according to claim 1, wherein the wire is made of copper.

6. A method for cutting a wire formed on a semiconductor substrate, the method comprising:
    forming a cut portion by scanning the semiconductor substrate with a focused ion beam to cut the wire; and
    forming a redundant portion, horizontally continuously from the cut portion, for preventing stray material from the wire from being formed continuously with the cut portion.

7. A method for cutting a wire formed on a semiconductor substrate, the method comprising:
    setting a cutting mode of the wire in accordance with the material of the wire;
    forming a cut portion by scanning the semiconductor substrate with a focused ion beam to cut the wire; and
    forming a clear region free of stray material from the wire, horizontally continuously from the cut portion by scanning the semiconductor substrate with the focused ion beam when a predetermined cutting mode is set.

8. A method 7, for cutting a wire formed on a semiconductor substrate, the method comprising:
    setting a cutting mode of the wire in accordance with the material of the wire:
    forming a cut portion by scanning the semiconductor substrate with a focused ion beam to cut the wire; and
    forming a clear region free of stray material from the wire, continuously from the cut portion by scanning the semiconductor substrate with the focused ion beam when a predetermined cutting mode is set; wherein said forming the cut portion includes forming a first cavity that cuts the wire by scanning the semiconductor substrate with the focused ion beam, and said forming the clear region includes forming a second cavity and a third cavity so that the first, second, and third cavities when combined form an H-shaped pattern.

9. The method according to claim 7, wherein the predetermined cutting mode is a cutting mode for a copper wire.

10. A device for cutting a wire formed on a semiconductor substrate, the device comprising:
    a processor for cutting a wire by scanning the semiconductor substrate with a focused ion beam; and
    a controller, connected to the processor, for controlling the scanning with the focused ion beam, the controller controlling the processor to form a cut portion by cutting the wire and forming a clear region free of stray material from the wire, horizontally continuously from the cut portion.

11. The device according to claim 10, wherein the controller controls the processor to form a first cavity that cuts the wire and a second cavity and a third cavity that intersect the first cavity on opposite sides of the wire.

12. A device, for cutting a wire formed on a semiconductor substrate, the device comprising:
    a processor for cutting a wire by scanning the semiconductor substrate with a focused ion beam; and
    a controller, connected to the processor, for controlling the scanning with the focused ion beam, the controller controlling the processor to form a cut portion by cutting the wire and forming a clear region free of stray material from the wire, continuously from the cut portion;
    wherein the controller controls the processor to form a first cavity that cuts the wire and a second cavity and a third cavity that intersect the first cavity on opposite sides of the wire; and
    wherein the controller controls the processor so that the first, second, and third cavities when combined form an H-shaped pattern.

13. The device according to claim 11, further comprising an input section for enabling positions of two points lying on opposite ends of the cut portion to be set.

14. The device according to claim 13, wherein the controller controls the processor to form the first, second, and third cavities based on the positions of the two set points.

15. The device according to claim 10, wherein the controller includes a memory for storing pattern data of at least one processing pattern formed on the semiconductor substrate, the controller controlling the processor with the pattern data.

16. The device according to claim 15, wherein the memory stores plural pieces of the pattern data in correspondence with various types of wire material, and the controller changes the processing pattern with reference to the plural pieces of pattern data stored in the memory.

* * * * *